(12) United States Patent
Hellwig et al.

(10) Patent No.: US 8,404,049 B2
(45) Date of Patent: Mar. 26, 2013

(54) EPITAXIAL BARREL SUSCEPTOR HAVING IMPROVED THICKNESS UNIFORMITY

(75) Inventors: Lance G. Hellwig, Florissant, MO (US); Srikanth Kommu, St. Charles, MO (US); John A. Pitney, St. Peters, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 1169 days.

(21) Appl. No.: 11/965,521

(22) Filed: Dec. 27, 2007

(65) Prior Publication Data
US 2009/0165719 A1 Jul. 2, 2009

(51) Int. Cl.
*C23C 16/00* (2006.01)
(52) U.S. Cl. .......................... 118/728; 118/725
(58) Field of Classification Search .................. 118/725, 118/728
See application file for complete search history.

(56) References Cited

U.S. PATENT DOCUMENTS

| | | |
|---|---|---|
| 3,675,619 A | 7/1972 | Burd |
| 3,806,360 A | 4/1974 | Briody |
| 4,322,592 A * | 3/1982 | Martin .......................... 219/634 |
| 4,496,609 A | 1/1985 | McNeilly et al. |
| 4,728,389 A | 3/1988 | Logar |
| 4,823,736 A | 4/1989 | Post et al. |
| 5,192,371 A | 3/1993 | Shuto et al. |
| 5,200,157 A | 4/1993 | Toya et al. |
| 5,242,501 A | 9/1993 | McDiarmid |
| 5,288,364 A | 2/1994 | Burt et al. |
| 5,298,107 A | 3/1994 | Scudder et al. |
| 5,350,455 A | 9/1994 | Mahler |
| 5,373,806 A | 12/1994 | Logar |
| 5,374,159 A | 12/1994 | Severns et al. |
| 5,439,523 A | 8/1995 | Yamaguchi |
| 5,441,571 A | 8/1995 | Ohta et al. |
| 5,476,359 A | 12/1995 | Severns et al. |
| 5,516,367 A | 5/1996 | Lei et al. |
| 5,518,549 A | 5/1996 | Hellwig |

(Continued)

FOREIGN PATENT DOCUMENTS

| | | |
|---|---|---|
| EP | 0746009 A1 | 4/1996 |
| EP | 0738789 A2 | 10/1996 |

(Continued)

OTHER PUBLICATIONS

International Search Report and Written Opinion from related application No. PCT/US2008/087930, dated Mar. 3, 2009.

(Continued)

*Primary Examiner* — Keath Chen
(74) *Attorney, Agent, or Firm* — Armstrong Teasdale LLP

(57) ABSTRACT

A barrel susceptor for supporting semiconductor wafers in a heated chamber having an interior space. Each of the wafers has a front surface, a back surface and a circumferential side. The susceptor includes a body having a plurality of faces arranged around an imaginary central axis of the body. Each face has an outer surface and a recess extending laterally inward into the body from the outer surface. Each recess is surrounded by a rim defining the respective recess. The susceptor also includes a plurality of ledges extending outward from the body. Each of the ledges is positioned in one of the recesses and includes an upward facing support surface for supporting a semiconductor wafer received in the recess. Each of the support surfaces is separate from the outer surface of the respective face.

7 Claims, 5 Drawing Sheets

U.S. PATENT DOCUMENTS

| | | | |
|---|---|---|---|
| 5,527,393 A | 6/1996 | Sato et al. | |
| 5,580,388 A | 12/1996 | Moore | |
| 5,679,405 A | 10/1997 | Thomas et al. | |
| 5,769,942 A | 6/1998 | Maeda | |
| 5,785,764 A | 7/1998 | Hoshina et al. | |
| 5,820,686 A | 10/1998 | Moore | |
| 5,897,380 A | 4/1999 | White et al. | |
| 5,904,769 A | 5/1999 | Ohashi | |
| 5,960,555 A | 10/1999 | Deaton et al. | |
| 5,968,277 A | 10/1999 | Landin et al. | |
| 6,086,680 A | 7/2000 | Foster et al. | |
| 6,110,289 A * | 8/2000 | Moore | 118/725 |
| 6,129,047 A | 10/2000 | Nakamura | |
| 6,129,048 A * | 10/2000 | Sullivan | 118/728 |
| 6,184,154 B1 | 2/2001 | Dietze et al. | |
| 6,444,027 B1 | 9/2002 | Yang | |
| 6,454,865 B1 | 9/2002 | Goodman et al. | |
| 6,596,095 B2 | 7/2003 | Ries et al. | |
| 6,652,650 B2 | 11/2003 | Yang et al. | |
| 7,048,316 B1 | 5/2006 | Blank | |
| 7,081,165 B2 | 7/2006 | Paik | |
| 7,101,794 B2 | 9/2006 | Schauer et al. | |
| 7,122,844 B2 | 10/2006 | Nakamura et al. | |
| 7,276,123 B2 | 10/2007 | Shimizu et al. | |
| 7,276,125 B2 | 10/2007 | Miyamoto et al. | |
| 7,285,483 B2 | 10/2007 | Schauer et al. | |
| 7,393,417 B1 | 7/2008 | Maeda | |
| 2002/0043337 A1 | 4/2002 | Goodman et al. | |
| 2002/0088389 A1 | 7/2002 | Kommu | |
| 2003/0037723 A9 | 2/2003 | Kommu | |
| 2004/0266181 A1 | 12/2004 | Schauer et al. | |
| 2005/0160991 A1 | 7/2005 | Miyamoto et al. | |
| 2005/0183829 A1 | 8/2005 | Goodman et al. | |
| 2006/0079089 A1 | 4/2006 | Schauer et al. | |
| 2006/0201623 A1 | 9/2006 | Yoo | |
| 2006/0231035 A1 | 10/2006 | Hellwig | |
| 2006/0291835 A1 | 12/2006 | Nozaki et al. | |
| 2007/0186858 A1 | 8/2007 | Kimoto et al. | |
| 2007/0218702 A1 | 9/2007 | Shimizu et al. | |
| 2008/0110401 A1 | 5/2008 | Fujikawa et al. | |
| 2008/0206464 A1 | 8/2008 | Kappeler | |

FOREIGN PATENT DOCUMENTS

| | | | |
|---|---|---|---|
| EP | 0757117 A1 | 5/1997 | |
| EP | 0289560 A2 | 3/1998 | |
| EP | 0863541 A1 | 9/1998 | |
| EP | 0757117 B1 | 7/1999 | |
| EP | 0633997 B1 | 11/2001 | |
| EP | 1154039 A1 | 11/2001 | |
| EP | 0730679 B1 | 12/2001 | |
| EP | 0746009 B1 | 2/2003 | |
| EP | 1308989 | 7/2003 | |
| EP | 1173632 B1 | 10/2003 | |
| EP | 1154039 B1 | 6/2006 | |
| EP | 1732111 A1 | 12/2006 | |
| JP | 58217495 A | 12/1983 | |
| JP | 06310431 A | 11/1994 | |
| JP | 07074114 A * | 3/1995 | |
| JP | 08325093 A | 12/1996 | |
| JP | 2000133187 | 5/2000 | |
| TW | 391999 B | 6/2000 | |
| WO | 9417353 A1 | 8/1994 | |
| WO | 9610659 A2 | 4/1996 | |
| WO | 9708743 | 3/1997 | |
| WO | 9923691 | 5/1999 | |
| WO | 0000664 A1 | 6/1999 | |
| WO | 0058533 A1 | 10/2000 | |

OTHER PUBLICATIONS

Singapore Written Opinion from Singapore Patent Application No. 201003884-2 filed on Dec. 22, 2008, dated Jun. 8, 2011; 5 pages.

Chinese Office Action dated Nov. 11, 2011 regarding Application No. 200880122656.3 filed on Jun. 24, 2010, 13 pages.

Japanese Office Action dated Jan. 24, 2012 regarding Application No. 2010-540824; 6 pages.

* cited by examiner

EPITAXIAL BARREL SUSCEPTOR HAVING IMPROVED THICKNESS UNIFORMITY

BACKGROUND

The present invention generally relates to an epitaxial barrel susceptor and more particularly to an epitaxial barrel susceptor including modified pockets.

Chemical vapor deposition is a process for growing a thin layer of material on a semiconductor wafer so lattice structures of the deposited material are identical to the wafer. Using this process, a layer having different conductivity may be applied to the semiconductor wafer to achieve the necessary electrical properties. Chemical vapor deposition is widely used in semiconductor wafer production to build up epitaxial layers so devices can be fabricated directly on the epitaxial layer. For example, a lightly doped epitaxial layer deposited over a heavily doped substrate permits a CMOS device to be optimized for latch up immunity as a result of a low electrical resistance of the substrate. Other advantages, such as precise control of a dopant concentration profile and freedom from oxygen are achieved. Conventional epitaxial deposition processes are disclosed in U.S. Pat. Nos. 5,904,769 and 5,769,942, which are incorporated by reference.

Epitaxial deposition takes place in a reactor. One type of reactor is called a barrel reactor or a batch reactor. A barrel reactor has a reaction chamber that houses a susceptor for holding wafers during epitaxial deposition. FIG. 1 illustrates a conventional barrel susceptor, which is designated in its entirety by the reference number 10. The susceptor 10 has generally vertical but slightly sloping faces 12. Each face 12 has two or more shallow recesses 14 aligned in a generally vertical column. Each recess 14 is generally circular and has a diameter suitable for receiving a single wafer (not shown). Each recess also has a planar surface 16 on which a back surface of the corresponding wafer rests. In most cases, the susceptor 10 is constructed of silicon-carbide-coated graphite to reduce contaminants such as iron from the graphite being released into the surrounding process gases. Conventional barrel susceptors are described in U.S. Pat. No. 6,129,048, which is incorporated by reference.

Prior to epitaxial deposition, semiconductor wafers are loaded in the recesses of the susceptor and the susceptor is lowered into a deposition chamber. The epitaxial deposition process begins by introducing a cleaning gas, such as hydrogen or a hydrogen and hydrochloric acid mixture, to a front surface of the wafer (i.e., a surface facing away from the susceptor) to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas, such as silane or a chlorinated silane, to the front surface of the wafer to deposit and grow an epitaxial layer of silicon on the front surface. The recesses of the susceptor may include orifices for simultaneously injecting hydrogen gas over a back surface of the wafer. During both steps, the susceptor rotates in the reaction chamber.

Barrel reactors are advantageous because they can simultaneously process a plurality of wafers and thus have a higher throughput, typically between six and fifteen wafers in a single run. However, one problem encountered using conventional barrel reactors is that frequently wafers processed do not meet current thickness uniformity requirements. Current thickness uniformity requirements mandate a thickness uniformity of less than about two percent and preferably, less than about one percent. Typical thickness uniformity of wafers processed in a barrel reactor using a conventional barrel susceptor is between about two percent and about five percent for a 200 millimeter (mm) diameter wafer having a ten millimeter edge exclusion. In recent years, most silicon wafers are processed in single wafer reactors to meet the stricter thickness uniformity requirements. The single wafer reactor has a much lower throughput than the barrel reactor because only one wafer is processed in a single run in the single wafer reactor.

Accordingly, there is a need for a barrel reactor susceptor capable of producing wafers meeting current thickness uniformity requirements.

SUMMARY

The present invention includes a barrel susceptor for supporting a plurality of semiconductor wafers in a heated chamber having an interior space. Each of the wafers has a front surface, a back surface opposite the front surface and a circumferential side extending around the front surface and the back surface. The susceptor is sized and shaped for receipt within the interior space of the chamber and for supporting the plurality of semiconductor wafers. The susceptor comprises a body having a plurality of faces arranged around an imaginary central axis of the body. Each face has an outer surface and a recess extending laterally inward into the body from the outer surface. Each recess is surrounded by a rim defining the respective recess. Further, the susceptor comprises a plurality of ledges extending outward from the body. Each of the ledges is positioned in one of the recesses and includes an upward facing support surface for supporting a semiconductor wafer received in the recess. Each of the support surfaces is separate from the outer surface of the respective face.

In another aspect, the present invention includes a barrel susceptor for supporting a plurality of semiconductor wafers in a heated chamber having an interior space. Each of the wafers has a front surface, a back surface opposite the front surface and a circumferential side extending around the front surface and the back surface. The susceptor is sized and shaped for receipt within the interior space of the chamber and for supporting the plurality of semiconductor wafers. The susceptor comprises a body having a plurality of faces arranged around an imaginary central axis of the body. Each face has an outer surface and a recess extending laterally inward into the body from the outer surface. Each recess is surrounded by a rim defining the respective recess. Further, the susceptor comprises a plurality of ledges extending outward from the body in each of the recesses. Each of the ledges includes an upward facing support surface for supporting a semiconductor wafer received in the recess.

The present invention also includes a barrel susceptor for supporting a plurality of semiconductor wafers in a heated chamber having an interior space. Each of the wafers has a front surface, a back surface opposite the front surface and a circumferential side extending around the front surface and the back surface. The susceptor is sized and shaped for receipt within the interior space of the chamber and for supporting the plurality of semiconductor wafers. The susceptor comprises a body having a plurality of faces arranged around an imaginary central axis of the body. Each face has an outer surface and a plurality of adjoining recesses extending laterally inward into the body from the outer surface. Each recess is at least partially surrounded by a rim defining the respective recess. In addition, the susceptor comprises a plurality of ledges extending outward from the body. Each of the ledges is defined by at least one of the rims defining the recesses and including an upward facing support surface for supporting a semiconductor wafer received in at least one of the recesses.

In yet another aspect, the present invention includes a barrel susceptor for supporting a plurality of semiconductor wafers in a heated chamber having an interior space. Each of the wafers has a front surface, a back surface opposite the front surface and a circumferential side extending around the front surface and the back surface. The susceptor is sized and shaped for receipt within the interior space of the chamber and for supporting the semiconductor wafers. The susceptor comprises a body having a plurality of faces arranged around an imaginary central axis of the body. Each face has an outer surface and a recess extending laterally inward into the body from the outer surface. Each recess is no more than about 0.045 inch deep. The susceptor further comprises a plurality of ledges extending outward from the body. Each of the ledges includes an upward facing support surface for supporting a semiconductor wafer received in one of the recesses.

In still another aspect, the present invention includes a barrel susceptor for supporting a plurality of semiconductor wafers in a heated chamber having an interior space. Each of the wafers has a front surface, a back surface opposite the front surface, a thickness measured between the front surface and the back surface, and a circumferential side extending around the front surface and the back surface. The susceptor is sized and shaped for receipt within the interior space of the chamber and for supporting the plurality of semiconductor wafers. The susceptor comprises a body having a plurality of faces arranged around an imaginary central axis of the body. Each face has an outer surface and a recess extending laterally inward into the body from the outer surface to a depth equal to the thickness of the respective wafer. The susceptor also includes a plurality of ledges extending outward from the body. Each of the ledges includes an upward facing support surface for supporting a semiconductor wafer received in one of the recesses.

Other objects and features will be in part apparent and in part pointed out hereinafter.

BRIEF DESCRIPTION OF DRAWINGS

Corresponding reference characters indicate corresponding parts throughout the drawings.

DETAILED DESCRIPTION

Figure 1:
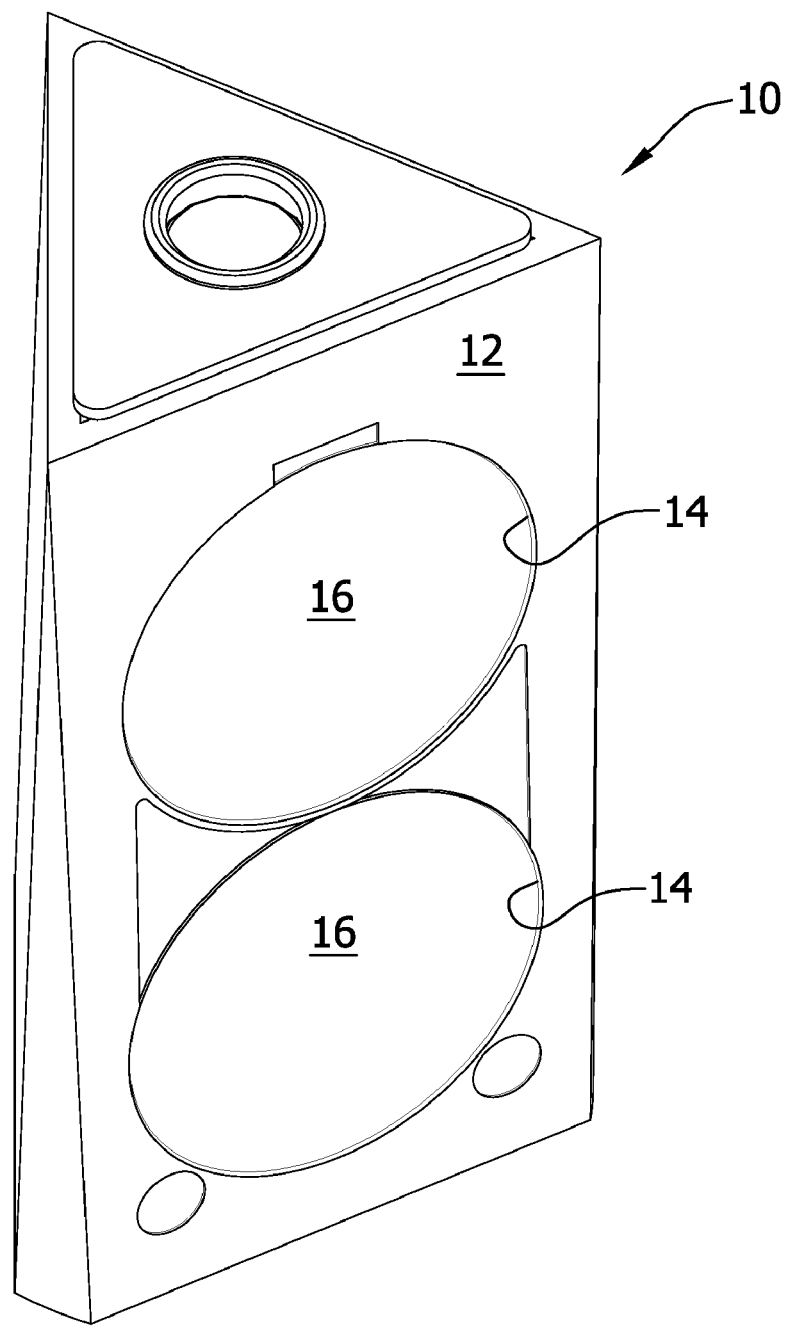
FIG. 1 is a perspective of a conventional barrel reactor susceptor.
Figure 2:
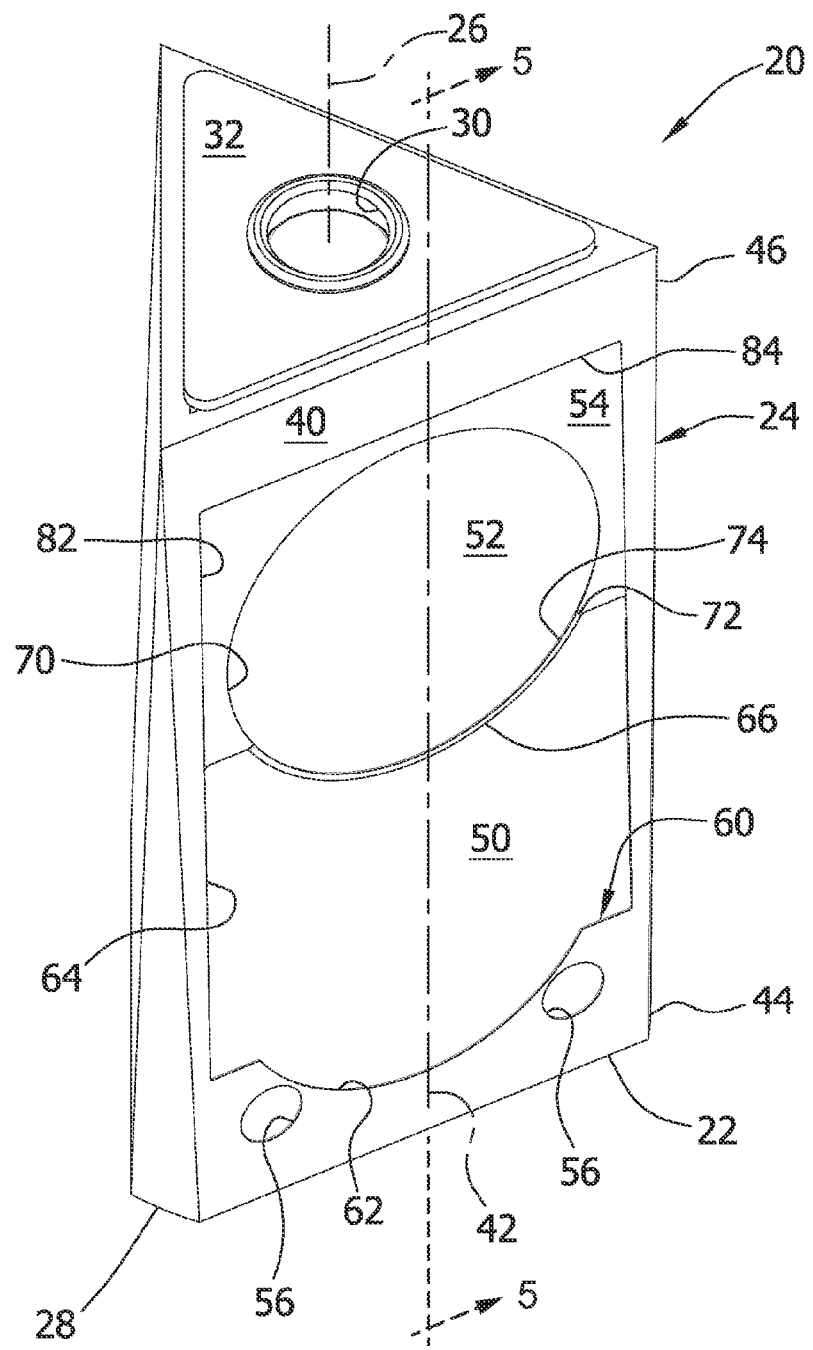
FIG. 2 is a perspective of a susceptor of a first embodiment of the present invention.

Referring now to the drawings, and more particularly to FIG. 2, a barrel susceptor for supporting a plurality of wafers in a barrel reactor is generally indicated by the reference number 20. The susceptor 20 includes a polyhedral body 22 having a plurality (e.g., three) trapezoidal faces, generally designated by 24, positioned symmetrically about an imaginary central axis 26 of the body. Triangular corner pieces 28 may separate the faces 24 of the susceptor 20. It should be understood that the body 22 may have other shapes without departing from the scope of the present invention. The body 22 has a hollow interior (not shown) that is in fluid communication with a port 30 through a top 32 of the body.

Referring to FIG. 2, each face 24 of the susceptor 20 includes a planar outer surface 40 having an imaginary longitudinal axis 42 extending from a bottom 44 of the face to a top 46 of the face opposite the bottom. Each face 24 slopes inward toward the central axis 26 of the body 22 at the top 46. Each face 24 also has a column of shallow recesses 50, 52, 54 centered on the corresponding longitudinal axis 42 and two evaluation piece recesses 56 adjacent the bottom 44 of the face. Although the evaluation piece recesses 56 may have other dimensions without departing from the scope of the present invention, in one embodiment each evaluation recess has a depth of about 0.050 inch and a diameter of about 1.3 inch. The evaluation recesses are used for holding smaller evaluation wafers, which can be destructively tested to evaluate the epitaxial process without sacrificing a production wafer.

Although the bottom recess 50 may have other depths without departing from the scope of the present invention, in one embodiment the bottom recess has a depth of about 0.045 inch. The bottom recess 50 is bordered by a rim, generally designated by 60, having a narrow rounded lower portion 62 adapted for holding a semiconductor wafer (not shown) during epitaxial processing. The rim 60 of the bottom recess 50 has narrow straight side portions 64 and a rounded upper portion 66, all of which are spaced from the wafer during epitaxial processing to allow gas circulation at an upper edge as well as at leading and trailing edges of the wafer in the bottom recess 50.

The middle recess 52 is positioned above the bottom recess 50. Although the middle recess 52 may have other depths without departing from the scope of the present invention, in one embodiment the middle recess has a depth of about 0.045 inch. The middle recess 52 has a generally circular rim 70 adapted to hold and surround a semiconductor wafer (not shown) during epitaxial processing. The bottom and middle recesses 50, 52, respectively, are separated by a curved ledge or protrusion 72 formed between the circular rim 70 of the middle recess and the rounded upper portion 66 of the rim 60 of the bottom recess. Although the ledge 72 may have other dimensions without departing from the scope of the present invention, in one embodiment the ledge has a width of about 0.138 inch and is flush with the face 24 of the susceptor 20. Accordingly, the ledge 72 has an upward facing support surface 74 having a width of about 0.045 inch for supporting a circumferential side of a semiconductor wafer during epitaxial processing.

The top recess 54 surrounds an upper portion of the middle recess 52. Although the top recess 54 may have other depths without departing from the scope of the present invention, in one embodiment the top recess has a depth of about 0.0165 inch. The top recess 54 is bordered by a rim 80 having narrow straight side portions 82 and a narrow straight upper portion 84 spaced from the wafer during epitaxial processing to allow gas circulation at an upper edge as well as at leading and trailing edges of the wafer. Although the ledge 72 of the middle recess 52 and the rounded lower portion 62 of the rim 60 of the bottom recess 50 may have other dimensions without departing from the scope of the present invention, in one embodiment each of theses features has an arc length of about 120° and a radius approximately equal to that of the wafers intended to be processed using the susceptor 20 (e.g., about 3.97 inches). In other embodiments, the dimensions of the different recesses may differ from each other. As the use and manufacture of the susceptor 20 are conventional and well known in the art, they will not be described in further detail.

In one particular embodiment, a difference between the depth of the middle recess 52 and the depth of the top recess 54 generally equals a thickness of the wafer so the outer surface of the wafer is substantially flush with the surface of the top recess. As a result of the wafer surface being flush with the top recess surface, gas flows smoothly across the wafer and is not disrupted at the leading edge of the wafer. Because the gas flows smoothly, the boundary layer remains thinner than it would if the flow were disrupted. Reactant gases must diffuse in through the boundary layer and reactant byproducts must diffuse out through the boundary layer. The thinner boundary layer improves diffusion, resulting in a thicker boundary layer.

Tests using the susceptor 20 described above yielded epitaxial thickness profiles that varied by less than about one micrometer over a 200 millimeter (mm) diameter wafer having a three millimeter edge exclusion. Moreover, the actual epitaxial thickness increased near the leading and trailing side edges of the wafer. This compares favorably with tests performed on the conventional susceptor 10 described in the background. The conventional susceptor yielded epitaxial thickness profiles that varied by more than about 1.2 micrometers (μm) over a 200 millimeter diameter wafer having a three millimeter edge exclusion. Further, the epitaxial thickness decreased by nearly one micrometer near the edges of the wafer compared to the thickness locations spaced from the edge.

Figure 3:
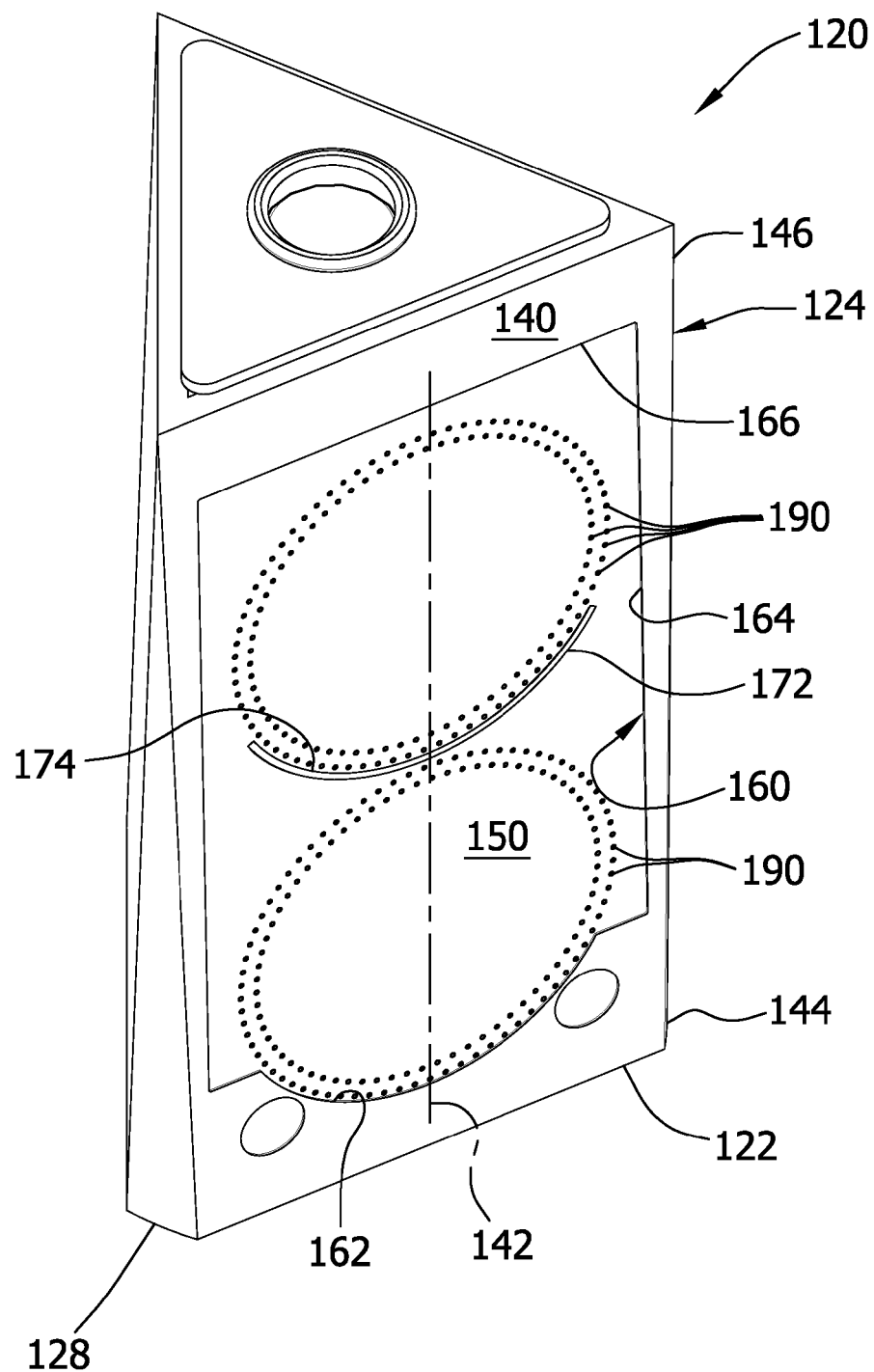
FIG. 3 is a perspective of a susceptor of a second embodiment.

FIG. 3 illustrates a second embodiment of the present invention, in which a barrel susceptor for supporting a plurality of wafers in a barrel reactor is generally indicated by the reference number 120. Because the susceptor 120 is similar to the susceptor 20 of the previous embodiment, like components will be indicated by corresponding reference numerals incremented by 100. The susceptor 120 includes a polyhedral body 122 having a plurality trapezoidal faces, generally designated by 124, positioned symmetrically about an imaginary central axis 126 of the body. Triangular corner pieces 128 may separate the faces 124 of the susceptor 120. The body 122 may have other shapes without departing from the scope of the present invention.

Each face 124 of the susceptor 120 has a planar outer surface 140 having an imaginary longitudinal axis 142 extending from a bottom 144 of the face to a top 146 of the face opposite the bottom. Each face 124 also has a shallow recess 150 centered on the corresponding longitudinal axis 142. Each face 124 slopes inward toward the central axis 126 of the body 122 at the top 146. In addition, each face 124 has two evaluation piece recesses 156 adjacent the bottom 144 of the face. Although the recess 150 may have other depths without departing from the scope of the present invention, in one embodiment the recess has a depth of about 0.045 inch. The recess 150 is bordered by a rim, generally designated by 160, having a narrow rounded lower portion 162 adapted for holding a semiconductor wafer (not shown) during epitaxial processing. The rim 160 of the recess 150 has narrow straight side portions 164 and a straight upper portion 166. A curved ledge or protrusion 172 is provided in the recess 150 for holding a second semiconductor wafer (not shown) during epitaxial processing. Although the ledge 172 may have other dimensions without departing from the scope of the present invention, in one embodiment the ledge has a width of about 0.138 inch and is flush with the face 124 of the susceptor 120. Accordingly, the ledge 172 has an upward facing support surface 174 having a width of about 0.045 inch for supporting a circumferential side of a semiconductor wafer during epitaxial processing. The side portions 164 and upper portion 166 of the rim 160 of the recess 150 are spaced from the wafers during epitaxial processing to allow gas circulation at an upper edge as well as at leading and trailing edges of the wafers in the recess. Although the ledge 172 and the rounded lower portion 162 of the rim 160 of the recess 150 may have other dimensions without departing from the scope of the present invention, in one embodiment each of these features has an arc length of about 120° and a radius of about 3.97 inches. In other embodiments, the dimensions of the different recesses may differ from each other. A series of holes 180 arranged in a concentric circular pattern is positioned in the recess 150 above the ledge 172 and the rounded lower portion 162 of the rim 160. The holes 190 are positioned behind the wafers when positioned in the recess 150 to reduce autodoping. As the holes 190 and other features of the susceptor 120 are conventional, they will not be described further. Tests on a susceptor 120 having the configuration described above yielded epitaxial thickness profiles that varied by less than about one micrometer over a 200 millimeter (mm) diameter wafer having a three millimeter edge exclusion. As with the susceptor 20 of the first embodiment, the actual epitaxial thickness increased near the leading and trailing side edges of the wafer.

Figure 4:
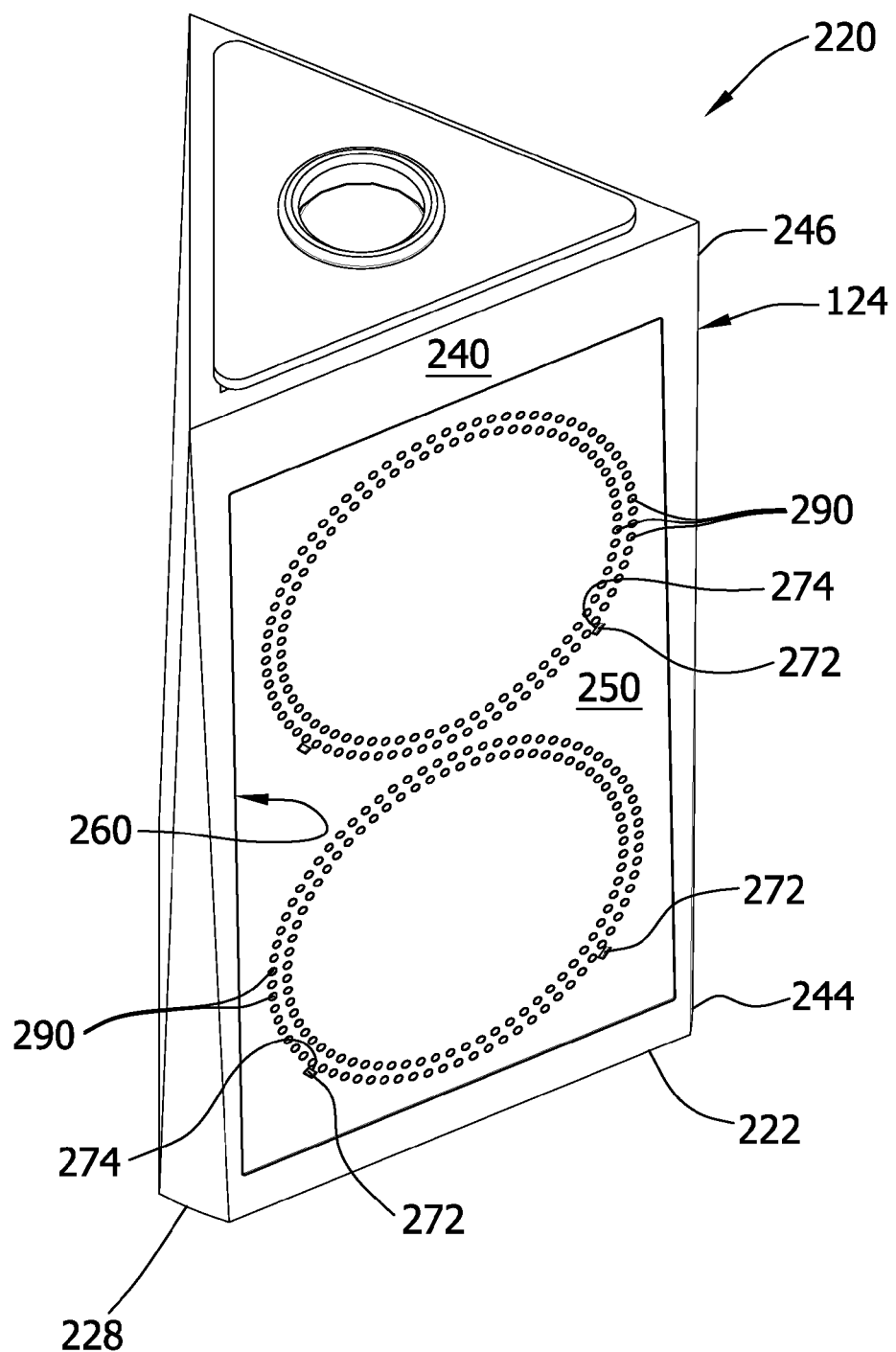
FIG. 4 is a perspective of a susceptor of a third embodiment.
Figure 5:
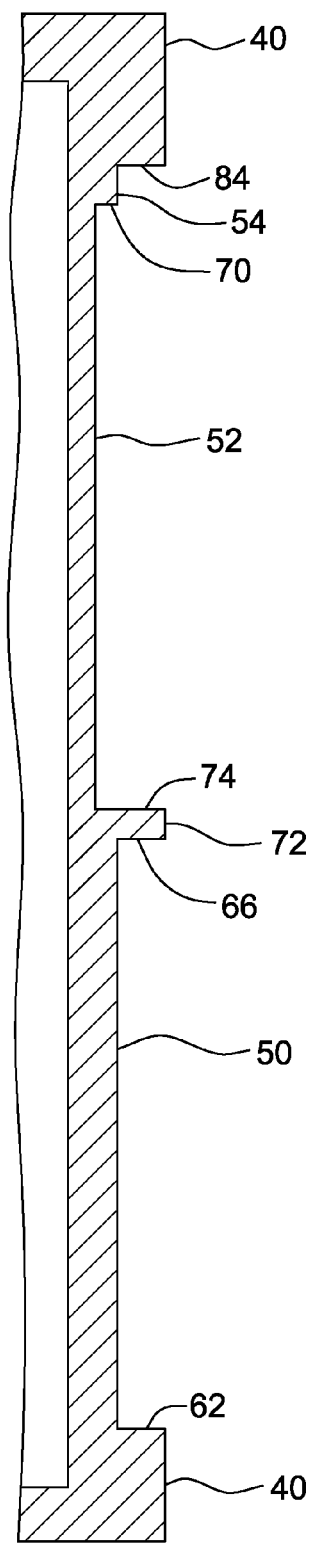
FIG. 5 is a partial sectional view taken along axis 42 of the susceptor illustrated in FIG. 2.

FIG. 4 illustrates a third embodiment of the present invention, in which a barrel susceptor for supporting a plurality of wafers in a barrel reactor is generally indicated by the reference number 220. Because the susceptor 220 is similar to the susceptor 120 of the previous embodiment, like components will be indicated by corresponding reference numerals incremented by 100. The susceptor 220 includes a polyhedral body 222 having trapezoidal faces 224 positioned symmetrically about an imaginary central axis 226 of the body. Triangular corner pieces 228 separate the faces 224 of the susceptor 220. The body 222 may have other shapes without departing from the scope of the present invention.

Each face 224 of the susceptor 220 has a planar outer surface 240 having an imaginary longitudinal axis 242 extending from a bottom 244 of the face to a top 246 of the face opposite the bottom. Each face 224 also has a shallow rectangular recess 250 centered on the corresponding longitudinal axis 242 and bordered by a rim, generally designated by 260. Each face 224 slopes inward toward the central axis 226 of the body 222 at the top 246. Although the recess 250 may have other depths without departing from the scope of the present invention, in one embodiment the recess has a depth of about 0.045 inch. A plurality of ledges or protrusions 272 (e.g., four) is provided in the recess 250 for holding semiconductor wafers (not shown) during epitaxial processing. Although the ledges 272 may have other dimensions without departing from the scope of the present invention, in one embodiment each ledge has a width of about 0.125 inch, a length of about 0.250 inch and is flush with the face 224 of the susceptor 220. Accordingly, each ledge 272 has an upward facing support surface 274 having a width of about 0.045 inch for supporting a circumferential side of a semiconductor wafer during epitaxial processing. Further, in one embodiment the ledges 272 are positioned at about 50° from the longitudinal axis 242 of the face 224 and at a radius of about 3.94 inches. The rim 260 of the recess 250 is spaced from the wafers during epitaxial processing to allow gas circulation completely around the wafers in the recess. A series of holes 290 is positioned in the recess 250 to reduce autodoping. Tests on a susceptor 220 having the configuration described above yielded epitaxial thickness profiles that varied by less than about one micrometer over a 200 millimeter (mm) diameter wafer having a three millimeter edge exclusion. As with the susceptor 20 of the first embodiment, the actual epitaxial thickness increased near the leading and trailing side edges of the wafer.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that several advantages are achieved by the present invention.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. A barrel susceptor for supporting a plurality of semiconductor wafers in a heated chamber having an interior space, each of said wafers having a front surface, a back surface opposite said front surface and a circumferential side extending around the front surface and the back surface, a wafer thickness measured between the front surface and the back surface, the susceptor being sized and shaped for receipt within the interior space of the chamber and for supporting the plurality of semiconductor wafers, the susceptor comprising:

a body having a plurality of faces arranged around an imaginary central axis of the body, each face having an outer surface with a top recess and a middle recess and one or more lower recesses adjoining and extending laterally inward into the body from the outer surface, each recess being surrounded by a rim, wherein the top recess and the middle recess have differing depths that equal the wafer thickness so that the front surface of the wafer is substantially flush with the surface of the top recess when the wafer is positioned in the middle recess; and at least one ledge along the middle recess having an upward facing support surface that is separate from the outer surface of the respective face to support the circumferential side of a wafer received in the middle recess.

2. A susceptor as set forth in claim 1 wherein each of said ledges has an outer surface that is flush with the outer surface of the respective face.

3. A susceptor as set forth in claim 1 wherein the supporting surface of each of said ledges has a radius corresponding to the semiconductor wafer supported by the supporting surface.

4. A susceptor as set forth in claim 1 wherein each of said ledges has an arc length no greater than about 120°.

5. A susceptor as set forth in claim 1 wherein each of said ledges has length of about 0.250 inch (6.350 mm).

6. A susceptor as set forth in claim 1 wherein each of said recesses has a depth no greater than about 0.045 inch (1.143 mm).

7. A susceptor as set forth in claim 6 wherein each of said ledges has a height about equal to the depth of the recess.

* * * * *

UNITED STATES PATENT AND TRADEMARK OFFICE
CERTIFICATE OF CORRECTION

| | | |
|---|---|---|
| PATENT NO. | : 8,404,049 B2 | Page 1 of 1 |
| APPLICATION NO. | : 11/965521 | |
| DATED | : March 26, 2013 | |
| INVENTOR(S) | : Hellwig et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1220 days.

Signed and Sealed this
Second Day of December, 2014

Michelle K. Lee
*Deputy Director of the United States Patent and Trademark Office*